(12) United States Patent
Elms (10) Patent No.: US 8,004,802 B2
(45) Date of Patent: Aug. 23, 2011

(54) OPERATIONAL AMPLIFIER CIRCUIT AND ARC FAULT CIRCUIT INTERRUPTER INCLUDING THE SAME

(75) Inventor: Robert T. Elms, Monroeville, PA (US)

(73) Assignee: Eaton Corporation, Cleveland, OH (US)

( * ) Notice: Subject to any disclaimer, the term of this patent is extended or adjusted under 35 U.S.C. 154(b) by 361 days.

(21) Appl. No.: 12/273,993

(22) Filed: Nov. 19, 2008

(65) Prior Publication Data

US 2010/0123983 A1    May 20, 2010

(51) Int. Cl.
*H02H 3/00* (2006.01)
*H02H 9/08* (2006.01)

(52) U.S. Cl. .............................................. 361/42; 361/2
(58) Field of Classification Search ............... 361/42, 361/2
See application file for complete search history.

(56) References Cited

U.S. PATENT DOCUMENTS

| | | | | |
|---|---|---|---|---|
| 6,570,392 | B2 * | 5/2003 | Macbeth et al. | 324/536 |
| 7,830,269 | B2 * | 11/2010 | Cheng et al. | 340/635 |
| 2008/0204949 | A1 | 8/2008 | Zhou et al. | |

OTHER PUBLICATIONS

Intersil Corporation, "EL5120, EL5220, EL5420", 12MHz Rail-to-Rail Input-Output Op Amps, FN7186.4, Feb. 21, 2005, 12 pp.
National Semiconductor Corporation, "LMH6645/46/47 2.7V, 650µA, 55MHz, Rail-to-Rail Input and Output Amplifiers with Shutdown Option", 2005, 19 pp.

* cited by examiner

*Primary Examiner* — Jared Fureman
*Assistant Examiner* — Lucy Thomas
(74) *Attorney, Agent, or Firm* — Martin J. Moran (57) ABSTRACT

An operational amplifier circuit is for an arc fault circuit interrupter including a current sensor having a secondary and an envelope detector circuit having an input. The operational amplifier circuit includes a band pass filter having an input structured to be electrically interconnected with the secondary of the current sensor and an output; and a rectifier circuit. The rectifier circuit includes an operational amplifier having an input electrically interconnected with the output of the band pass filter and an output, a half-wave rectifier having an input electrically interconnected with the output of the operational amplifier, an output, and a forward voltage between the input and the output of the half-wave rectifier, the half-wave rectifier output being structured to be electrically interconnected with the input of the envelope detector circuit, and a voltage compensation circuit cooperating with the input and the output of the operational amplifier to compensate for the forward voltage.

21 Claims, 4 Drawing Sheets

OPERATIONAL AMPLIFIER CIRCUIT AND ARC FAULT CIRCUIT INTERRUPTER INCLUDING THE SAME

BACKGROUND

1. Field

The disclosed concept pertains generally to circuit interrupters and, more particularly, to arc fault circuit interrupters. The disclosed concept also pertains to arc fault detectors for arc fault circuit interrupters and, more particularly, to operational amplifier circuits for such arc fault detectors.

2. Background Information

Circuit breakers are used to protect electrical circuitry from damage due to an overcurrent condition, such as an overload condition or a relatively high level short circuit or fault condition. In small circuit breakers, commonly referred to as miniature circuit breakers, used for residential and light commercial applications, such protection is typically provided by a thermal-magnetic trip device. This trip device includes a bimetal, which heats and bends in response to a persistent overcurrent condition. The bimetal, in turn, unlatches a spring powered operating mechanism, which opens the separable contacts of the circuit breaker to interrupt current flow in the protected power system.

An arc fault circuit interrupter (AFCI) is a device intended to mitigate the effects of arc faults by functioning to deenergize an electrical circuit when an arc fault is detected. Non-limiting examples of AFCIs include: (1) arc fault circuit breakers; (2) branch/feeder arc fault circuit interrupters, which are intended to be installed at the origin of a branch circuit or feeder, such as a panelboard, and which may provide protection from series arc faults, ground faults and line-to-neutral faults up to the outlet; (3) outlet circuit arc fault circuit interrupters, which are intended to be installed at a branch circuit outlet, such as an outlet box, in order to provide protection of cord sets and power-supply cords connected to it (when provided with receptacle outlets) against the unwanted effects of arcing, and which may provide protection from series arc faults, line-to-ground faults and line-to-neutral faults; (4) cord arc fault circuit interrupters, which are intended to be connected to a receptacle outlet, in order to provide protection to an integral or separate power supply cord; (5) combination arc fault circuit interrupters, which function as either a branch/feeder or an outlet circuit AFCI; and (6) portable arc fault circuit interrupters, which are intended to be connected to a receptacle outlet and provided with one or more outlets.

United States Patent Application Publication No. 2008/0204949 discloses an AFCI including a number of circuits each having a two-stage band pass filter, a peak detector and an envelope detector in combination with a current sensor, such as a current transformer (CT). For example, if two CTs are employed, then the CTs not only measure two high frequency signals from the sensed current, but also measure the power frequency signal from the sensed current. The CTs sense di/dt and their outputs are integrated over a finite time period to obtain a current signal. Two CTs can be employed to optimize outputs in corresponding desired frequency ranges, in order that significant amplification of the CTs' outputs is avoided. The CT outputs are input by corresponding, different two-stage band pass filters. The outputs of the filters are input by two peak detectors, and by two envelope detectors. The outputs of the peak detectors are input by input channels of an analog-to-digital converter (ADC) for a processor. The outputs of the envelope detectors are input by negative inputs of two comparators, which use references at their positive inputs. The outputs of the comparators are input by an OR gate, and the OR gate output is input by a counter of the processor. Plural high frequency, relatively narrow bands of the corresponding band pass filters are completely separated and do not overlap. The peak detector outputs of the high frequency signals above predefined thresholds are either 'OR'ed or 'AND'ed to determine if there is an arc fault.

Figure 1:
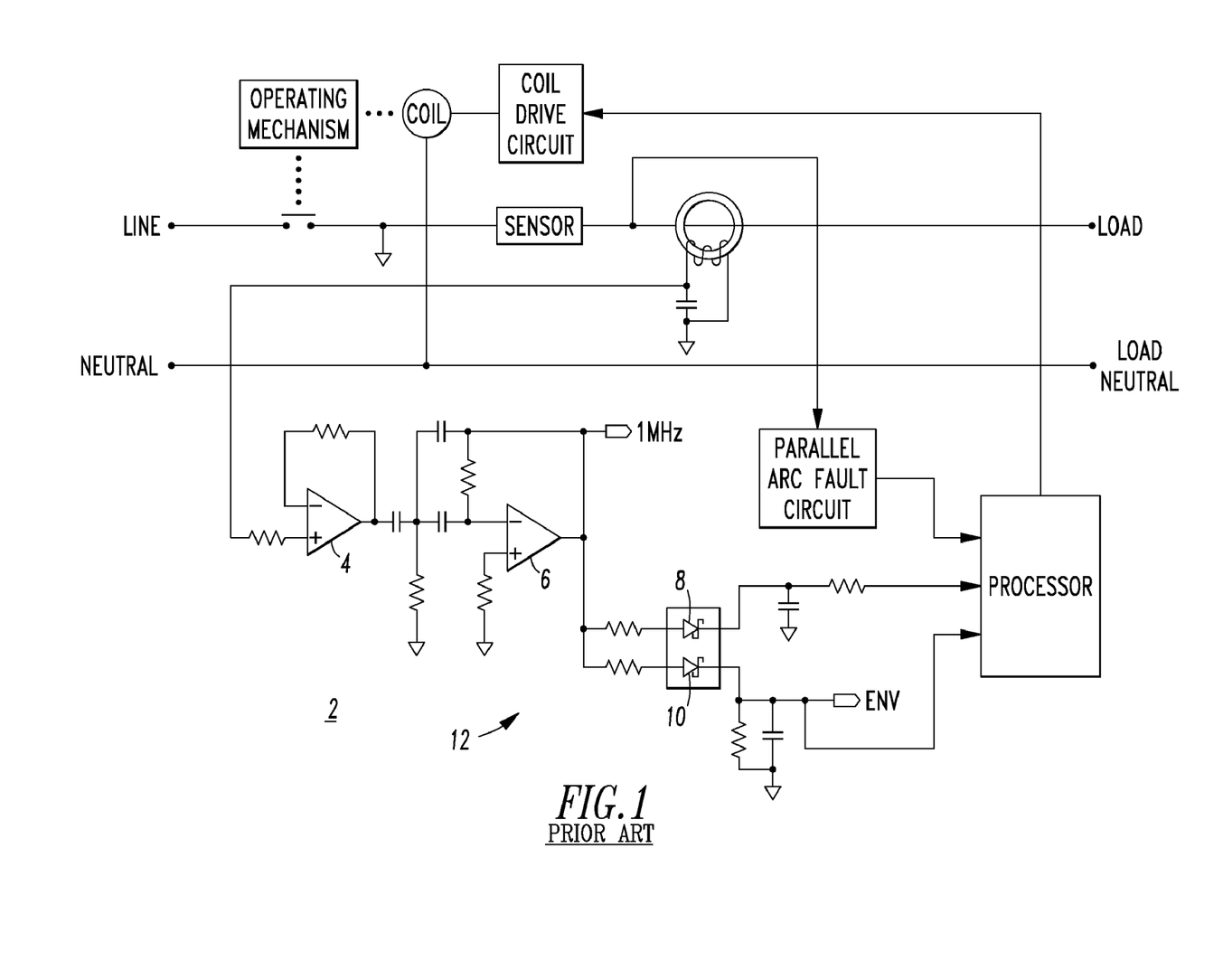
FIG. 1 is a block diagram in schematic diagram of a portion of an arc fault circuit interrupter using a dual, high frequency operational amplifier and two Schottky diodes to detect high frequency arcing signals.

Referring to FIG. 1, an AFCI 2 includes two high frequency operational amplifiers 4,6 and two Schottky diodes 8,10 to detect high frequency (e.g., about 1 MHz) arcing signals. For example, an LM6646 dual operational amplifier has a 55 MHz gain-bandwidth (GBW), 22 v/μs slew rate, and a maximum power consumption of 1400 μA per operational amplifier (or 2800 μA total). An arc fault detection (AFD) circuit 12 detects the peak high frequency signal and counts the number of bursts of high frequency for each half cycle. However, the AFD circuit 12 completely loses signal information at relatively low signal levels due to the forward voltage of the Schottky diodes 8,10. Hence, information as to the minimum high frequency signal and the duration of the high frequency signal can be lost (e.g., high frequency signals below about 20% of full scale).

There is room for improvement in arc fault circuit interrupters.

There is also room for improvement in operational amplifier circuits for arc fault circuit interrupters.

SUMMARY

An arc fault circuit interrupter circuit to detect high frequency arcing signals using a log amplifier circuit is possible, although this has a corresponding relatively high cost and complexity. Hence, a relatively simple circuit is needed that provides relatively wide dynamic range signal detection at a relatively low cost and a relatively low power consumption.

These needs and others are met by embodiments of the disclosed concept, which employ a single operational amplifier circuit and active diode forward voltage compensation to achieve relatively wide dynamic range signal detection. This circuit preferably provides discrimination between relatively short spikes of high frequency noise (e.g., without limitation, associated with motor brushes) and more sustained high frequency noise (e.g., associated with arc faults).

In accordance with one aspect of the disclosed concept, an operational amplifier circuit is for an arc fault circuit interrupter comprising a current sensor including a secondary and a processor including a number of inputs. The operational amplifier circuit comprises: a band pass filter comprising an input structured to be electrically interconnected with the secondary of the current sensor and an output; a rectifier circuit comprising an operational amplifier comprising an input electrically interconnected with the output of the band pass filter and an output, a half-wave rectifier comprising an input electrically interconnected with the output of the operational amplifier, an output, and a forward voltage between the input and the output of the half-wave rectifier, and a voltage compensation circuit cooperating with the input and the output of the operational amplifier to compensate for the forward voltage; and an envelope detector circuit comprising an input electrically interconnected with the output of the half-wave rectifier and an output structured to be input by one of the number of inputs of the processor.

The half-wave rectifier may further comprise a first diode including an anode. The voltage compensation circuit may comprise a second diode including an anode and a cathode, a resistor electrically interconnected in series with the second diode and a capacitor electrically connected in parallel with the second diode. The anodes of the first and second diodes may be electrically connected to the output of the operational amplifier. The cathode of the second diode may be electrically connected to the input of the operational amplifier.

The output of the operational amplifier may include a first voltage; the input of the operational amplifier may include a second smaller voltage; and the first voltage less the second smaller voltage may be equal to the forward voltage between the input and the output of the half-wave rectifier.

As another aspect of the disclosed concept, an arc fault circuit interrupter comprises: separable contacts; an operating mechanism structured to open and close the separable contacts; an arc fault detector structured to determine an arc fault trip condition operatively associated with the separable contacts, the arc fault detector comprising: a current sensor structured to sense a current flowing through the separable contacts, the current sensor including a secondary, a processor including a number of inputs and an output, a band pass filter comprising an input electrically interconnected with the secondary of the current sensor and an output, a rectifier circuit comprising an operational amplifier comprising an input electrically interconnected with the output of the band pass filter and an output, a half-wave rectifier comprising an input electrically interconnected with the output of the operational amplifier, an output, and a forward voltage between the input and the output of the half-wave rectifier, and a voltage compensation circuit cooperating with the input and the output of the operational amplifier to compensate for the forward voltage, and an envelope detector circuit comprising an input electrically interconnected with the output of the half-wave rectifier and an output electrically interconnected to one of the number of inputs of the processor; and a trip mechanism cooperating with the output of the processor and the operating mechanism to trip open the separable contacts responsive to the determined arc fault trip condition.

As another aspect of the disclosed concept, an operational amplifier circuit is for an arc fault circuit interrupter comprising a current sensor including a secondary and an envelope detector circuit comprising an input. The operational amplifier circuit comprises: a band pass filter comprising an input structured to be electrically interconnected with the secondary of the current sensor and an output; and a rectifier circuit comprising an operational amplifier comprising an input electrically interconnected with the output of the band pass filter and an output, a half-wave rectifier comprising an input electrically interconnected with the output of the operational amplifier, an output, and a forward voltage between the input and the output of the half-wave rectifier, the output of the half-wave rectifier being structured to be electrically interconnected with the input of the envelope detector circuit, and a voltage compensation circuit cooperating with the input and the output of the operational amplifier to compensate for the forward voltage.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that a part is "electrically interconnected with" one or more other parts shall mean that the parts are directly electrically connected together or are electrically connected together through one or more electrical conductors or generally electrically conductive intermediate parts. Further, as employed herein, the statement that a part is "electrically connected to" one or more other parts shall mean that the parts are directly electrically connected together or are electrically connected together through one or more electrical conductors.

The disclosed concept is described in association with a single pole arc fault circuit interrupter, such as a miniature arc fault circuit breaker, although the disclosed concept is applicable to arc fault circuit interrupters having any number of poles.

Figure 2:
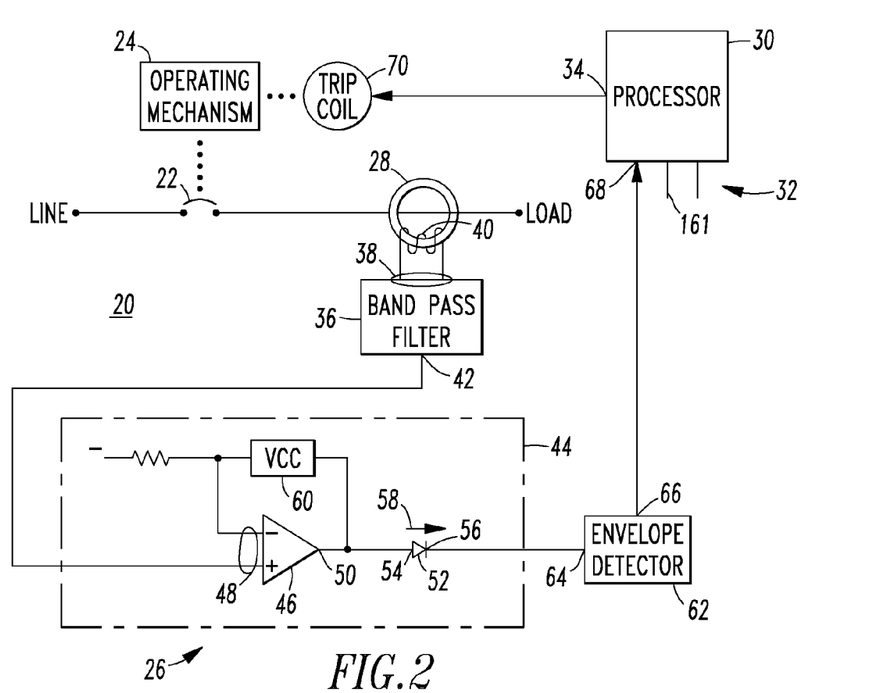
FIG. 2 is a block diagram in schematic form of an arc fault circuit interrupter including a processor, a band pass filter, a rectifier circuit and an envelope detector circuit in accordance with embodiments of the disclosed concept.

Referring to FIG. 2, an AFCI 20 includes separable contacts 22, an operating mechanism 24 structured to open and close the separable contacts 22, and an arc fault detector 26 structured to determine an arc fault trip condition operatively associated with the separable contacts 22. The arc fault detector 26 includes a current sensor, such as current transformer 28, structured to sense a current flowing through the separable contacts 22, a processor 30 including a number of inputs 32 and an output 34, a band pass filter 36 including an input 38 electrically interconnected with the secondary 40 of the current transformer 28 and an output 42, and a rectifier circuit 44. The rectifier circuit 44 includes an operational amplifier 46 having an input 48 electrically interconnected with the band pass filter output 42 and an output 50. A half-wave rectifier 52 includes an input 54 electrically interconnected with the operational amplifier output 50, an output 56, and a forward voltage 58 between the input 54 and the output 56 of the half-wave rectifier 52. A voltage compensation circuit (VCC) 60 cooperates with the input 48 and the output 50 of the operational amplifier 46 and is structured to compensate for the forward voltage 58, as will be explained. A envelope detector circuit 62 includes an input 64 electrically interconnected with the output 56 of the half-wave rectifier 52 and an output 66 electrically interconnected to input 68 of the processor 30. A trip mechanism 70 (e.g., without limitation, a trip coil) cooperates with the output 34 of the processor 30 and the operating mechanism 24 to trip open the separable contacts 22 responsive to the arc fault trip condition as determined by the processor 30.

Figure 3:
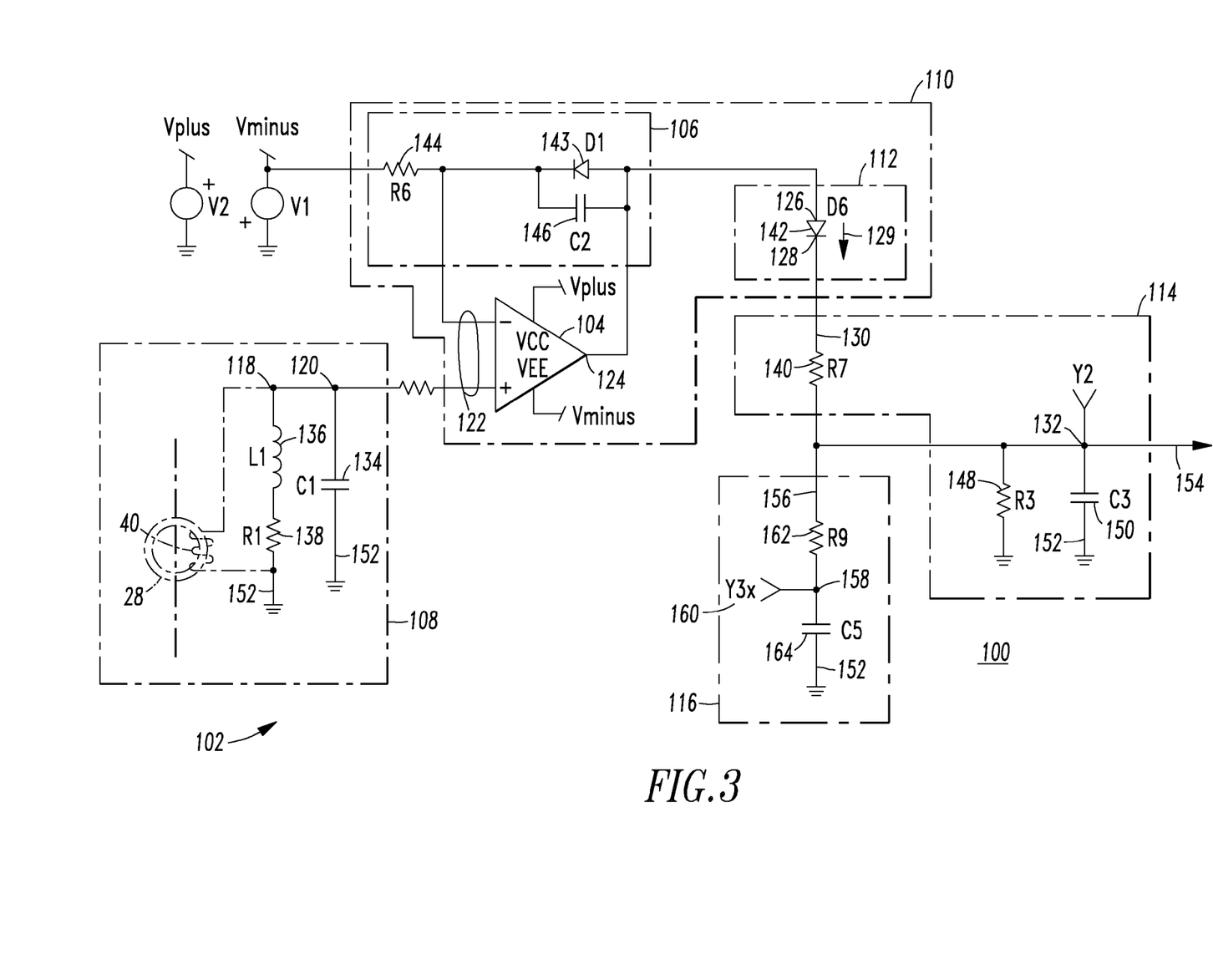
FIG. 3 is a block diagram in schematic form of a simple, wide dynamic range, high frequency, operational amplifier circuit for an arc fault circuit interrupter in accordance with an embodiment of the disclosed concept.

FIG. 3 shows a portion of an example arc fault detection (AFD) circuit 100 for one pole of an AFCI, such as AFCI 20 of FIG. 2. The AFD circuit 100 includes, for example, a current transformer (e.g., 28 of FIG. 2), a processor (e.g., 30 of FIG. 2), and an operational amplifier circuit 102, as shown. The operational amplifier circuit 102 employs a single operational amplifier 104 and an active diode forward voltage compensation circuit 106 to achieve relatively wide dynamic range signal detection at, for example and without limitation, about 1 MHz.

The operational amplifier circuit 102 includes a band pass filter 108 (e.g., a suitable narrow band, tuned filter circuit), a rectifier circuit 110 including the operational amplifier 104, a half-wave rectifier 112, and the compensation circuit 106.

Example 1

The operational amplifier circuit 102 can also include an envelope detector circuit 114. The AFD circuit 100 can also include an averaging circuit 116, as shown.

Example 2

The band pass filter 108 includes an input 118 structured to be electrically interconnected with the secondary 40 (shown in phantom line drawing in FIG. 3) of the current transformer 28 (FIG. 2) and an output 120. The operational amplifier 104 includes an input (+) 122 electrically interconnected with the output 120 of the band pass filter 108 and an output 124. The half-wave rectifier 112 (e.g., diode) includes an input 126 (e.g., anode) electrically interconnected with the output 124 of the operational amplifier 104, an output 128 (e.g., cathode), and a forward voltage 129 between the input 126 and the output 128 of the half-wave rectifier 112. The compensation circuit 106 cooperates with the input (−) 122 and the output 124 of the operational amplifier 104 to compensate for the forward voltage 129.

Example 3

The envelope detector circuit 114 includes an input 130 electrically interconnected with the output 128 of the half-wave rectifier 112 and an output 132 structured to be input by one (e.g., 68 of FIG. 2) of the number of processor inputs 32 (FIG. 2).

Example 4

The band pass filter 108 includes a capacitor 134 (C1), an inductor 136 (L1) and a resistor 138 (R1). The capacitor 134 is electrically connected in parallel with the series combination of the inductor 136 and the resistor 138. The band pass filter 108 cooperates with the current transformer 28 (FIG. 2) to form a narrow band tuned filter. The inductor 136 and the resistor 138 are part of the secondary 40 of the current transformer 28.

Example 5

The half-wave rectifier 112 includes a first diode 142 (D6) having an anode. The compensation circuit 106 includes a second diode 143 (D1) having an anode and a cathode, a resistor 144 (R6) electrically interconnected in series with the second diode 143 and a capacitor 146 (C2) electrically connected in parallel with the second diode 143. The anodes of the first and second diodes 142,143 are electrically connected to the output 124 of the operational amplifier 104. The cathode of the second diode 143 is electrically connected to the input (−) 122 of the operational amplifier 104.

Example 6

The voltage of the operational amplifier output 124 is above the instantaneous voltage at input 122 by the forward voltage of the diode 142. The second diode 143, the capacitor 146 and the resistor 144 provide an internal DC offset signal to compensate for the forward voltage 129 of the first diode 142. Hence, the first and second diodes 142,143 are preferably matched.

Example 7

The operational amplifier output 124 includes a first voltage. The input 122 of the operational amplifier 104 includes a second smaller voltage. The first voltage less the second smaller voltage is equal to the forward voltage 129 between the input 126 and the output 128 of the half-wave rectifier 112.

Example 8

The envelope detector circuit 114 includes a first resistor 140 (R7) including a first end and an opposite second end, a second resistor 148 (R3) and a capacitor 150 (C3). The first end of the first resistor 140 is electrically connected to the output 128 of the half-wave rectifier 112. The opposite second end of the first resistor 140 is structured to be electrically connected to one of the number of inputs 32 of the processor 30 (FIG. 2). The parallel combination of the second resistor 148 and the capacitor 150 is electrically connected between the second end of the first resistor 140 and a ground reference 152.

Example 9

The resistor 148 and the capacitor 150 provide a time constant of about 0.02 mS. The envelope detector circuit 114 is responsive to a frequency range up to about 8 kHz, in order to provide a filtered envelope signal 154 at the output 132 thereof.

Example 10

The envelope detector circuit 114 can include or cooperate with the averaging circuit 116, which includes an input 156 electrically connected to the output 132 of the envelope detector circuit 114 and an output 158 structured to output a short term average value signal 160 (Y3x) to one (e.g., 161 of FIG. 2) of the number of inputs 32 of the processor 30 (FIG. 2).

Example 11

The averaging circuit 116 includes a resistor 162 (R9) electrically connected between the input 156 and the output 158 of the averaging circuit 116 and a capacitor 164 (C5) electrically connected between the output 158 of the averaging circuit 116 and the ground reference 152.

Example 12

The resistor 162 and the capacitor 164 cause the averaging circuit 116 to look at a suitable short term average value (e.g., without limitation, R9*C5=about 0.22 mS) of the filtered envelope signal 154 (Y2).

Example 13

The resistor 162 and the capacitor 164 are structured to output a short term average of the output 124 of the operational amplifier 102, in order to reflect both magnitude and duty cycle of the operational amplifier output 124.

Example 14

The short term average value signal 160 is the short term average value (e.g., without limitation, a 0.22 mS time constant as provided by the resistor 162 and the capacitor 164) of the filtered envelope signal 154 (Y2) (e.g., without limitation, 0.020 mS time constant as provided by the resistor 148 and the capacitor 150), which is derived from the voltage across the current transformer secondary 40 (FIG. 2) that arises from the primary current of the current transformer 28 (FIG. 2). Because the short term average value signal 160 (Y3x) is an averaged value, its magnitude reflects both the magnitude and the duty cycle of the filtered envelope signal 154 (Y2).

The operational amplifier circuit 102 does not require a relatively high gain-bandwidth performance from the operational amplifier 104. For example, about 10 MHz provides suitable gain-bandwidth performance. In contrast, known prior circuits employ a relatively high gain-bandwidth of about 55 MHz.

Example 15

Figure 4:
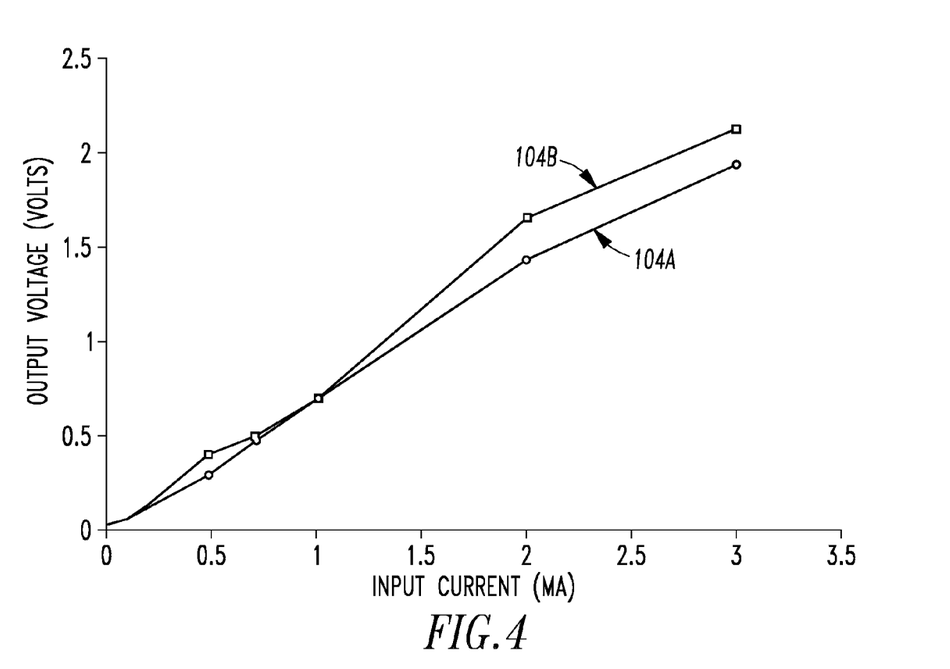
FIG. 4 is a plot of operational amplifier output voltage versus current transformer input current in accordance with embodiments of the disclosed concept.

Referring to FIG. 4, Table 1, below, shows the transfer function for a first example operational amplifier 104A (e.g., without limitation, National Semiconductor LM6645, with gain-bandwidth=50 MHz). For example, at a 1.0 mA input, the peak output voltage is 0.694 V at 998 kHz.

TABLE 1

| I input (mA) to current transformer 28 | V output from operational amplifier 104A |
|---|---|
| 0.00 | 0.032 |
| 0.10 | 0.062 |
| 0.20 | 0.125 |
| 0.48 | 0.290 |
| 0.70 | 0.470 |
| 1.00 | 0.694 |
| 2.00 | 1.426 |
| 3.00 | 1.924 |

Example 16

Table 2, below, shows the transfer function for a second example operational amplifier 104B (e.g., without limitation, Intersil EL5120, with gain-bandwidth=12 MHz). For example, at a 1.0 mA input, the peak output voltage is 0.687 V at 996 kHz.

TABLE 2

| I input (mA) to current transformer 28 | V output from operational amplifier 104B |
|---|---|
| 0.00 | 0.035 |
| 0.10 | 0.060 |
| 0.20 | 0.134 |
| 0.48 | 0.395 |
| 0.70 | 0.496 |
| 1.00 | 0.687 |
| 2.00 | 1.649 |
| 3.00 | 2.177 |

Example 17

In the disclosed operational amplifier circuit 102 of FIG. 3, the diode 143 and the corresponding parallel capacitor 146 provide active compensation for the high frequency detector diode forward voltage of diode 142 using the single high frequency operational amplifier 104. For example, the operational amplifier 104 preferably provides at least a 10 MHz gain-bandwidth and a slew rate of at least 10 v/µs. For example, an Intersil EL5220 (e.g., 12 MHz gain-bandwidth, 10 v/µs slew rate, and maximum power consumption of about 750 µA per operational amplifier) is very acceptable and only the single operational amplifier part is needed.

Performance is, thus, improved while cost is reduced and high frequency operational amplifier power consumption is reduced by a factor of almost four. For example, this could halve the corresponding total power needs of an AFCI. The short term average value signal 160 (e.g., averaged over a corresponding sampling period) is available as well as the filtered envelope signal 154 (Y2).

Example 18

The operational amplifier circuit 102 is structured to provide a signal detection range having a full scale value and a minimum value of less than 3% of the full scale value. This provides almost a 10-to-1 improvement in dynamic range signal detection over the circuit 12 of FIG. 1.

Example 19

The operational amplifier circuit 102 is structured to discriminate between first high frequency noise of a first duration and second high frequency noise of a longer second duration. For example, the first high frequency noise can be a number of bursts of high frequency noise caused by motor brush commutation, and the second high frequency noise can be a sustained arcing event. Hence, the disclosed circuit 102 advantageously discriminates between bursts of high frequency noise at the time of commutation by motor brushes and arcing events.

Figure 5:
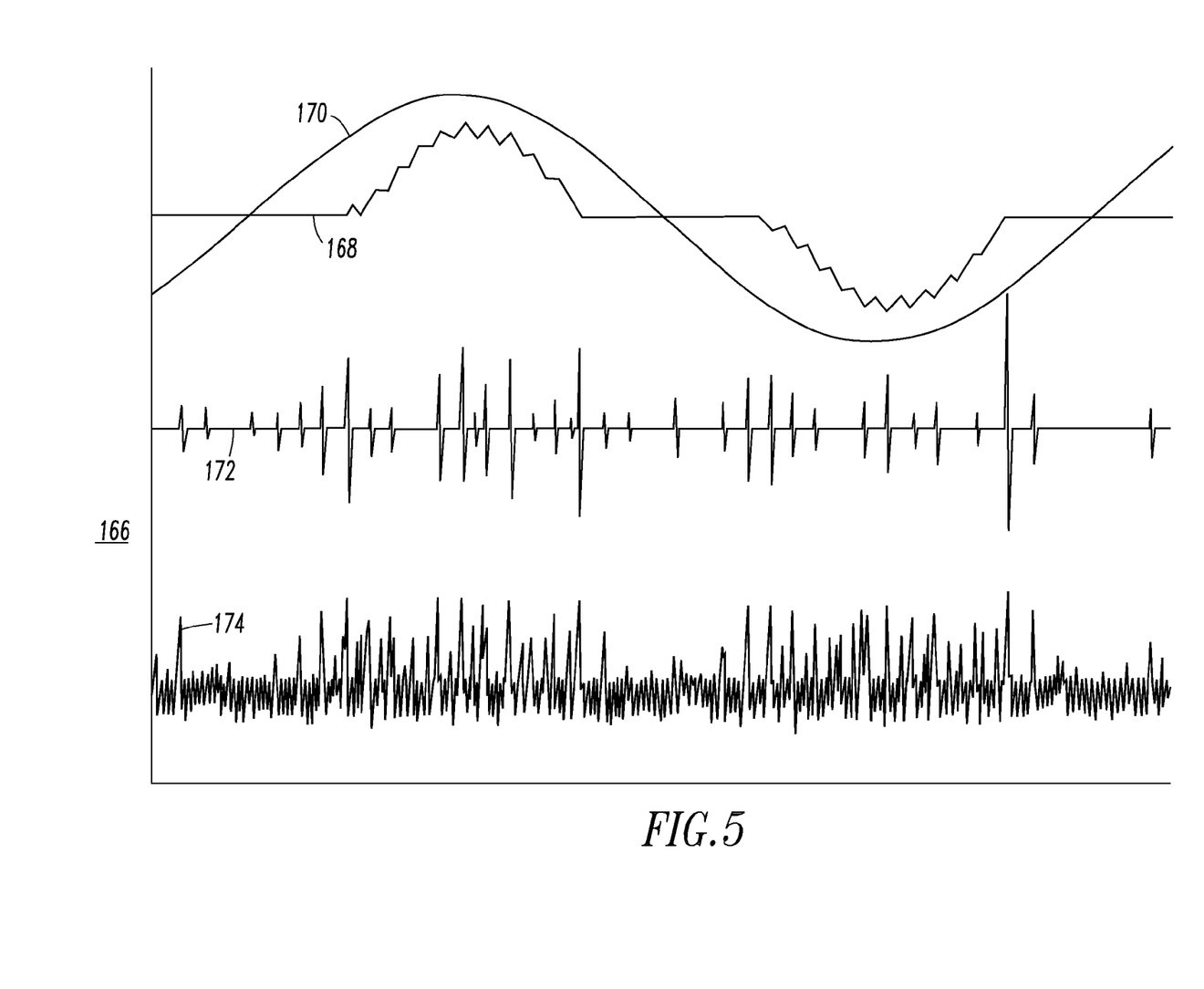
FIG. 5 is a plot of line voltage, line current, a high frequency signal across a high frequency current transformer, and a log scale version of the high frequency signal for the operational amplifier circuit of FIG. 3.

Referring to FIG. 5, a plot 166 is shown of line voltage 170, line current 168, a high frequency signal 172 across the high frequency current transformer 28 (FIG. 2), and a log scale version 174 of the high frequency signal for the AFD circuit 100 of FIG. 3. Motor brushes output a burst (e.g., short spikes) of high frequency noise at the time of commutation followed by no noise until the next commutation point. In contrast, arc faults produce more sustained or continuous high frequency noise during the arcing process. The short term average value signal 160 (Y3x) of FIG. 3 allows determination of noise duty cycle. If the envelope signal 154 were sampled only at the commutation points, then it could appear as a continuous signal. However, the signal 160 can provide a much smaller value, thereby indicating a non-continuous/steady noise signal.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An operational amplifier circuit for an arc fault circuit interrupter comprising a current sensor including a secondary and a processor including a number of inputs, said operational amplifier circuit comprising:
   a band pass filter comprising an input structured to be electrically interconnected with the secondary of said current sensor and an output;
   a rectifier circuit comprising:
      an operational amplifier comprising an input electrically interconnected with the output of said band pass filter and an output,
      a half-wave rectifier comprising an input electrically interconnected with the output of said operational amplifier, an output, and a forward voltage between the input and the output of said half-wave rectifier, and
      a voltage compensation circuit cooperating with the input and the output of said operational amplifier to compensate for said forward voltage; and
   an envelope detector circuit comprising an input electrically interconnected with the output of said half-wave rectifier and an output structured to be input by one of the number of inputs of said processor,
   wherein said envelope detector circuit further comprises an averaging circuit including an input electrically connected to the output of said envelope detector circuit and an output structured to output a short term average value signal to one of the number of inputs of said processor.

2. The operational amplifier circuit of claim 1 wherein said band pass filter further comprises a capacitor, an inductor and a resistor; and wherein the capacitor is electrically connected in parallel with the series combination of the inductor and the resistor.

3. The operational amplifier circuit of claim 1 wherein said half-wave rectifier further comprises a first diode including an anode; wherein said voltage compensation circuit comprises a second diode matched with the first diode and including an anode and a cathode, a resistor electrically interconnected in series with said second diode and a capacitor electrically connected in parallel with said second diode; wherein the anodes of said first and second diodes are electrically connected to the output of said operational amplifier; and wherein the cathode of said second diode is electrically connected to the input of said operational amplifier.

4. The operational amplifier circuit of claim 3 wherein the output of said operational amplifier includes a first voltage; wherein the input of said operational amplifier includes a second smaller voltage; and wherein the first voltage less the second smaller voltage is equal to the forward voltage between the input and the output of said half-wave rectifier.

5. The operational amplifier circuit of claim 1 wherein said envelope detector circuit further comprises a first resistor including a first end and a second end, a second resistor and a capacitor; wherein the first end of said first resistor is electrically connected to the output of said half-wave rectifier; wherein the second end of said first resistor is structured to be electrically connected to one of the number of inputs of said processor; and wherein the parallel combination of said second resistor and said capacitor is electrically connected between the second end of said first resistor and a ground reference.

6. The operational amplifier circuit of claim 5 wherein said second resistor and said capacitor provide a time constant of about 0.02 mS; and wherein said envelope detector circuit is responsive to a frequency range up to about 8 kHz, in order to provide a filtered envelope signal at the output thereof.

7. The operational amplifier circuit of claim 1 wherein said averaging circuit comprises a resistor electrically connected between the input and the output of said averaging circuit and a capacitor electrically connected between the output of said averaging circuit and a ground reference.

8. The operational amplifier circuit of claim 7 wherein said resistor and said capacitor provide a time constant of about 0.22 mS.

9. The operational amplifier circuit of claim 7 wherein said resistor and said capacitor are structured to output a short term average of the output of said operational amplifier, in order to reflect both magnitude and duty cycle of the output of said operational amplifier.

10. The operational amplifier circuit of claim 1 wherein said operational amplifier circuit is structured to discriminate between first high frequency noise of a first duration and second high frequency noise of a longer second duration.

11. The operational amplifier circuit of claim 10 wherein said first high frequency noise is a number of bursts of high frequency noise caused by motor brush commutation; and wherein said second high frequency noise is a sustained arcing event.

12. The operational amplifier circuit of claim 1 wherein said operational amplifier includes a gain-bandwidth of about 10 MHz.

13. The operational amplifier circuit of claim 1 wherein said operational amplifier includes a slew rate of at least 10 MHz.

14. The operational amplifier circuit of claim 1 wherein said operational amplifier includes a maximum power consumption of about 750 μA.

15. The operational amplifier circuit of claim 1 wherein said operational amplifier circuit is structured to provide a signal detection range having a full scale value and a minimum value of less than 3% of said full scale value.

16. An arc fault circuit interrupter comprising:
   separable contacts;
   an operating mechanism structured to open and close said separable contacts;
   an arc fault detector structured to determine an arc fault trip condition operatively associated with said separable contacts, said arc fault detector comprising:
      a current sensor structured to sense a current flowing through said separable contacts, said current sensor including a secondary,
      a processor including a number of inputs and an output,
      a band pass filter comprising an input electrically interconnected with the secondary of said current sensor and an output,
      a rectifier circuit comprising:
         an operational amplifier comprising an input electrically interconnected with the output of said band pass filter and an output,
         a half-wave rectifier comprising an input electrically interconnected with the output of said operational amplifier, an output, and a forward voltage between the input and the output of said half-wave rectifier, and a voltage compensation circuit cooperating with the input and the output of said operational amplifier to compensate for said forward voltage, and an envelope detector circuit comprising an input electrically interconnected with the output of said half-wave rectifier and an output electrically interconnected to one of the number of inputs of said processor, wherein said envelope detector circuit further comprises an averaging circuit including an input electrically connected to the output of said envelope detector circuit and an output structured to output a short term average value signal to one of the number of inputs of said processor; and a trip mechanism cooperating with the output of said processor and said operating mechanism to trip open said separable contacts responsive to said determined arc fault trip condition.

17. The arc fault circuit interrupter of claim 16 wherein said half-wave rectifier further comprises a first diode including an anode; wherein said voltage compensation circuit comprises a second diode matched with the first diode and including an anode and a cathode, a resistor electrically connected in series with said second diode and a capacitor electrically connected in parallel with said second diode; wherein the anodes of said first and second diodes are electrically connected to the output of said operational amplifier; and wherein the cathode of said second diode is electrically connected to the input of said operational amplifier.

18. The arc fault circuit interrupter of claim 17 wherein the output of said operational amplifier includes a first voltage; wherein the input of said operational amplifier includes a second smaller voltage; and wherein the first voltage less the second smaller voltage is equal to the forward voltage between the input and the output of said half-wave rectifier.

19. The arc fault circuit interrupter of claim 16 wherein said arc fault detector is structured to discriminate between first high frequency noise of a first duration and second high frequency noise of a longer second duration.

20. The arc fault circuit interrupter of claim 16 wherein said operational amplifier includes a gain-bandwidth of about 10 MHz; and wherein said arc fault detector is structured to provide a signal detection range having a full scale value and a minimum value of less than 3% of said full scale value.

21. An operational amplifier circuit for an arc fault circuit interrupter comprising a current sensor including a secondary, a processor including a number of inputs, and an envelope detector circuit comprising an input and an output structured to be input by one of the number of inputs of said processor, said operational amplifier circuit comprising:

a band pass filter comprising an input structured to be electrically interconnected with the secondary of said current sensor and an output;

a rectifier circuit comprising:

an operational amplifier comprising an input electrically interconnected with the output of said band pass filter and an output, a half-wave rectifier comprising an input electrically interconnected with the output of said operational amplifier, an output, and a forward voltage between the input and the output of said half-wave rectifier, the output of said half-wave rectifier being structured to be electrically interconnected with the input of said envelope detector circuit, and a voltage compensation circuit cooperating with the input and the output of said operational amplifier to compensate for said forward voltage; and an averaging circuit including an input structured to be electrically connected to the output of said envelope detector circuit and an output structured to output a short term average value signal to one of the number of inputs of said processor.

* * * * *